(12) United States Patent
Yoshino et al.

(10) Patent No.: US 9,213,415 B2
(45) Date of Patent: Dec. 15, 2015

(54) REFERENCE VOLTAGE GENERATOR

(71) Applicant: Seiko Instruments Inc., Chiba (JP)

(72) Inventors: Hideo Yoshino, Chiba (JP); Jun Osanai, Chiba (JP); Masayuki Hashitani, Chiba (JP); Yoshitsugu Hirose, Chiba (JP)

(73) Assignee: SEIKO INSTRUMENTS INC. (JP)

( * ) Notice: Subject to any disclaimer, the term of this patent is extended or adjusted under 35 U.S.C. 154(b) by 60 days.

(21) Appl. No.: 13/755,545

(22) Filed: Jan. 31, 2013

(65) Prior Publication Data

US 2013/0207636 A1 Aug. 15, 2013

(30) Foreign Application Priority Data

Feb. 13, 2012 (JP) ................... 2012-028733

(51) Int. Cl.
*H01L 29/76* (2006.01)
*G06F 3/02* (2006.01)
*H01L 27/088* (2006.01)

(52) U.S. Cl.
CPC ................. *G06F 3/02* (2013.01); *H01L 27/088* (2013.01); *H01L 27/0883* (2013.01)

(58) Field of Classification Search
CPC ...... H01L 27/088; H01L 27/0883; G05F 3/02

USPC .......................... 257/288, 368, 369
See application file for complete search history.

(56) References Cited

U.S. PATENT DOCUMENTS

| 4,446,383 A * | 5/1984 | Concannon et al. ........... 327/541 |
| 2002/0060600 A1* | 5/2002 | Ueda .............................. 327/540 |
| 2009/0146731 A1* | 6/2009 | Yoshida et al. ................ 327/543 |

FOREIGN PATENT DOCUMENTS

JP 59200320 11/1984

* cited by examiner

*Primary Examiner* — Matthew E Warren
(74) *Attorney, Agent, or Firm* — Adams & Wilks

(57) ABSTRACT

A reference voltage generator has a depletion mode MOS transistor of a first conductivity type for supplying a constant current flow, and an enhancement mode MOS transistor of the first conductivity type having a diode connection to the depletion mode MOS transistor for generating a reference voltage based on a constant current supplied by the depletion mode MOS transistor. The enhancement mode MOS transistor has a mobility substantially equal to a mobility of the depletion mode MOS transistor such that the enhancement mode MOS transistor and the depletion mode MOS transistor have substantially equal temperature characteristics.

3 Claims, 2 Drawing Sheets

REFERENCE VOLTAGE GENERATOR

BACKGROUND OF THE INVENTION

1. Field of the Invention

The present invention relates to a reference voltage generator for generating a reference voltage in a semiconductor integrated circuit.

2. Description of the Related Art

FIG. 2 shows a circuit used in a conventional reference voltage generator. A depletion mode NMOS transistor (D-mode NMOS) 10 is connected to operate as a current source, and supplies a constant current flow into an enhancement mode NMOS transistor (E-mode NMOS) 20 having a diode connection. The constant current generates, across the E-mode NMOS 20, a reference voltage corresponding to the threshold voltage and size of each transistor. In this case, the gate of the D-mode NMOS 10 is doped with N-type impurities, and the gate of the E-mode NMOS 20 is doped with P-type impurities (see, for example, Japanese Published Patent Application 59-200320 (FIG. 2)).

In recent years, electronic devices have become more precise, and ICs for controlling the electronic devices are thus required to be more precise in various aspects. For example, in order to realize higher-precision electric characteristics of an IC, it has been required that a reference voltage generator generate a high-precision reference voltage in the IC even when the temperature changes, that is, temperature characteristics of the reference voltage be flatter.

SUMMARY OF THE INVENTION

The present invention has been made in view of the above-mentioned requirements, and it is an object thereof to provide a reference voltage generator having flatter temperature characteristics.

In order to achieve the above-mentioned object, according to an exemplary embodiment of the present invention, there is provided a reference voltage generator, including: a depletion mode MOS transistor of a first conductivity type, which is connected to function as a current source and allows a constant current to flow; and an enhancement mode MOS transistor of the first conductivity type, which has a diode connection, has a mobility substantially equal to a mobility of the depletion mode MOS transistor, and generates a reference voltage based on the constant current.

According to the present invention, the depletion mode MOS transistor of the first conductivity type and the enhancement mode MOS transistor of the first conductivity type have substantially equal mobilities, and thus have substantially equal temperature characteristics. Temperature characteristics of the reference voltage are consequently improved.

DETAILED DESCRIPTION OF THE PREFERRED EMBODIMENT

Referring to the accompanying drawings, an embodiment of the present invention is described below.

Figure 1:
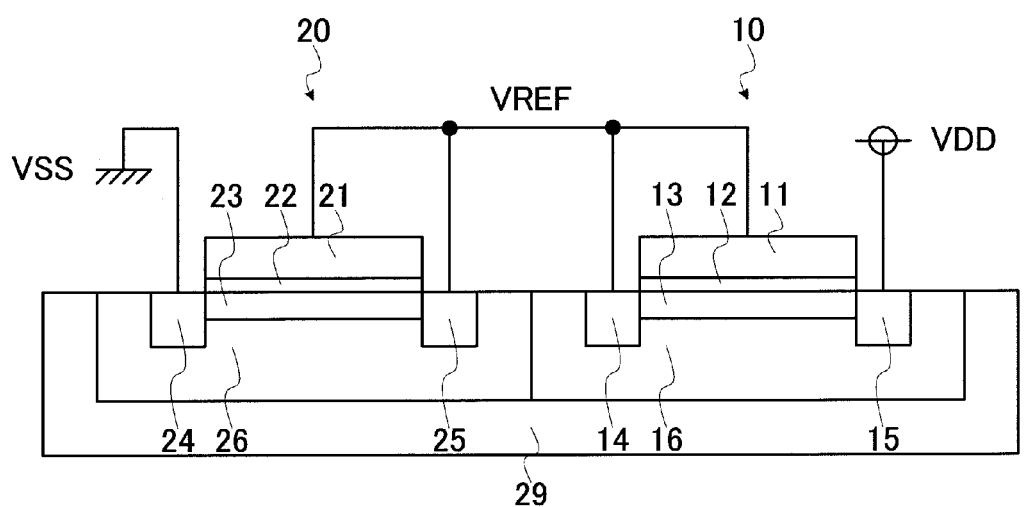
FIG. 1 is a cross-sectional diagram of a reference voltage generator.

First, the basic structure of a reference voltage generator is described with reference to a cross-sectional diagram of FIG. 1.

Figure 2:
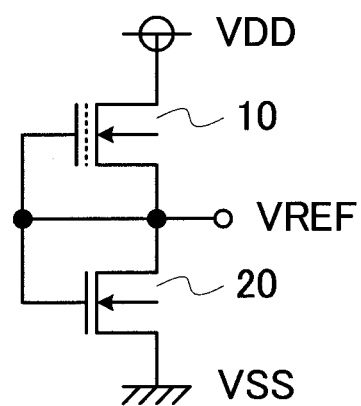
FIG. 2 is a diagram illustrating an equivalent circuit of the reference voltage generator.

The reference voltage generator includes a depletion mode NMOS transistor (D-mode NMOS) 10 and an enhancement mode NMOS transistor (E-mode NMOS) 20. In the D-mode NMOS 10, a gate electrode 11 and a source 14 are connected to a reference voltage generation terminal, and a drain 15 is connected to a power supply terminal. With those connections, the D-mode NMOS 10 functions as a current source. In the E-mode NMOS 20, a gate electrode 21 and a drain 25 are connected to the reference voltage generation terminal, and a source 24 is connected to a ground terminal. In other words, the E-mode NMOS 20 having a diode connection is connected in series to the D-mode NMOS 10. Therefore, the reference voltage generator has an equivalent circuit illustrated in FIG. 2, which is equivalent to the conventional circuit.

In order to form the D-mode NMOS 10, a P-type well 16 is first formed in the surface of a P-type substrate 29. Then, an N-type channel doped region 13 is formed in the surface of the well 16. Subsequently, a gate insulating film 12 is formed on the channel doped region 13. After that, the N-type gate electrode 11 is formed on the gate insulating film 12. Further, the N-type source 14 and the N-type drain 15 are formed in the surface of the well 16 so as to sandwich the channel doped region 13 formed under the gate electrode 11 and the gate insulating film 12.

In the D-mode NMOS 10, the polarity of the gate electrode 11 is formed into the N-type, which is the same as the polarity of the source 14 and the drain 15. This increases the difference between the work function of the N-type gate electrode 11 and the work function of the P-type well 16, and an electric field is applied in a direction of inverting the substrate surface. Thus, a threshold voltage of the D-mode NMOS 10 decreases to such an extent that the D-mode NMOS 10 becomes the depletion mode. The presence of the N-type channel doped region 13 further decreases the threshold voltage, and a channel is formed inside the substrate, thereby forming a buried channel. In this case, impurity implantation into the gate electrode 11 and the channel doped region 13 is controlled as appropriate so that the D-mode NMOS 10 becomes the depletion mode.

In order to form the E-mode NMOS 20, a P-type well 26 is first formed in the surface of the P-type substrate 29. Then, an N-type channel doped region 23 is formed in the surface of the well 26. Subsequently, a gate insulating film 22 is formed on the channel doped region 23. After that, the P-type gate electrode 21 is formed on the gate insulating film 22. Further, the N-type source 24 and the N-type drain 25 are formed in the surface of the well 26 so as to sandwich the channel doped region 23 formed under the gate electrode 21 and the gate insulating film 22.

In the E-mode NMOS 20, the polarity of the gate electrode 21 is formed into the P-type, which is different from the polarity of the source 24 and the drain 25. This decreases the difference between the work function of the P-type gate electrode 21 and the work function of the P-type well 26, but an electric field is applied in a direction of accumulating holes in the substrate surface. Thus, a threshold of the E-mode NMOS 20 increases. In order to decrease the threshold appropriately, the channel doped region 23 containing N-type impurities is formed in the surface of the P-type well 26. In this case, impurity implantation into the gate electrode 21 and the channel doped region 23 is controlled as appropriate so that the E-mode NMOS 20 becomes the enhancement mode.

It is noted that the substrate 29 is not limited to the P-type, and may be an N-type substrate.

The source 14 of the D-mode NMOS 10, which is connected so as to function as a current source, allows a constant current to flow into the drain 25 of the E-mode NMOS 20 having a diode connection. The constant current generates a reference voltage at the drain 25, which is a reference voltage generation terminal, of the E-mode NMOS 20.

Next, temperature characteristics of a reference voltage VREF generated by the reference voltage generator are described.

Herein, the channel doped region 13 of the D-mode NMOS 10 is subjected to channel doping to such an extent that the polarity of the surface of the well 16 is inverted. In this case, the polarity of impurities of the channel doped region 13 is different from the polarity of impurities of the well 16, and hence the D-mode NMOS 10 has a buried channel. On the other hand, the E-mode NMOS 20 has, on the surface of a well region, the channel doped region 23 containing N-type impurities whose polarity is different from that of the well 26 in order to decrease the threshold, and hence it is considered that the E-mode NMOS 20 has a buried channel similarly.

On this occasion, in the D-mode NMOS 10 and the E-mode NMOS 20 having the gates of different polarities of impurities, if the impurities below the surface of the substrate 29 are formed to have the same profile, it is expected that the buried channels having equal depths are generated. Thus, it is expected that the D-mode NMOS 10 and the E-mode NMOS 20 have equal temperature characteristics, and the temperature characteristics of the reference voltage VREF are improved.

However, as a result of earnest efforts of multilateral experiments and the like, the inventors of the present invention have found the following phenomenon. In the D-mode NMOS 10 and the E-mode NMOS 20, the gate electrodes have different polarities of impurities, and hence the work functions between the gate electrode and the substrate are different. Further, gate voltages (threshold voltages) for turning ON the channel are different, and electric fields applied to the channel doped region when the channel is turned ON are also different. Specifically, the threshold voltage of the E-mode NMOS 20 is higher than the threshold voltage of the D-mode NMOS 10, and the electric field applied to the channel of the E-mode NMOS 20 is larger correspondingly. Therefore, carriers in the D-mode NMOS 10 flow in a region below the surface of the substrate 29, and carriers in the E-mode NMOS 20 flow in the vicinity of the surface of the substrate 29. In other words, it has been found that the D-mode NMOS 10 is of a buried channel type, but the E-mode NMOS 20 is not of a buried channel type. This means that the carriers in the E-mode NMOS 20 are affected by the interface state, and hence the mobility of the E-mode NMOS 20 decreases, and the temperature characteristics of the D-mode NMOS 10 and the E-mode NMOS 20 are not equal to each other. In other words, the temperature characteristics of the reference voltage VREF are not improved.

In view of the foregoing, according to the present invention, in the D-mode NMOS 10 and the E-mode NMOS 20, the gate impurity concentration, the materials of the gate insulating films, the thicknesses of the gate insulating films, the profiles of the impurities below the surface of the substrate 29, and the like are appropriately controlled, to thereby obtain equal mobilities. This enables the D-mode NMOS 10 and the E-mode NMOS 20 to have equal temperature characteristics, thus improving the temperature characteristics of the reference voltage VREF. It is noted that the mobility as used herein, mobility which can be easily determined from current-voltage characteristics of transistors can be used.

First Embodiment

The materials of the gate oxide film 22 of the E-mode NMOS 20 and the gate oxide film 12 of the D-mode NMOS 10 are selected as appropriate so that the gate oxide film 22 may have a dielectric constant higher than the dielectric constant of the gate oxide film 12. This increases the capacitance of the gate oxide film of the E-mode NMOS 20 correspondingly, thus reducing an electric field applied to the channel and increasing the mobility. In expectation of this effect, if the mobilities of the D-mode NMOS 10 and the E-mode NMOS 20 are set to be substantially equal to each other, the temperature characteristics thereof also become substantially equal to each other, and the temperature characteristics of the reference voltage VREF can be flattened.

Second Embodiment

The gate oxide film 22 of the E-mode NMOS 20 is formed to be thinner than the gate oxide film 12 of the D-mode NMOS 10. This increases the capacitance of the gate oxide film of the E-mode NMOS 20 correspondingly, thus reducing an electric field applied to the channel and increasing the mobility. In expectation of this effect, if the mobilities of the D-mode NMOS 10 and the E-mode NMOS 20 are set to be substantially equal to each other, the temperature characteristics thereof also become substantially equal to each other, and the temperature characteristics of the reference voltage VREF can be flattened Third Embodiment Phosphorus is used as the impurities of the channel doped region 23 of the E-mode NMOS 20, and arsenic is used as the impurities of the channel doped region 13 of the D-mode NMOS 10. The atomic radius of phosphorus is smaller than the atomic radius of arsenic, and hence the mean free path of phosphorus is longer than the mean free path of arsenic. This increases the mobility of the E-mode NMOS 20 correspondingly. In expectation of this effect, if the mobilities of the D-mode NMOS 10 and the E-mode NMOS 20 are set to be substantially equal to each other, the temperature characteristics thereof also become substantially equal to each other, and the temperature characteristics of the reference voltage VREF can be flattened.

It is noted that it is sufficient that main impurities of the channel doped region 23 are phosphorus and main impurities of the channel doped region 13 are arsenic. For example, the impurities of the channel doped region 23 maybe phosphorus, and the impurities of the channel doped region 13 may be arsenic and phosphorus. Alternatively, the impurities of the channel doped region 23 may be arsenic and phosphorus, and the impurities of the channel doped region 13 may be arsenic. Alternatively, the impurities of the channel doped region 23 may be arsenic and phosphorus, and the impurities of the channel doped region 13 may also be arsenic and phosphorus. In this case, the doping amounts of arsenic and phosphorus are controlled as appropriate so that the mobilities of the D-mode NMOS 10 and the E-mode NMOS 20 may be equal to each other.

Further, the channel doped region 23 may be divided as appropriate so as to provide a phosphorus region to be doped with phosphorus and an arsenic region to be doped with arsenic. Alternatively, the channel doped region 13 may be divided as appropriate. Alternatively, both the channel doped region 23 and the channel doped region 13 may be divided as appropriate. The channel doped region 23 and the channel doped region 13 may be divided in the gate length direction or may be divided in the gate width direction. In this case, the phosphorus region and the arsenic region are provided as appropriate so that the mobilities of the D-mode NMOS 10 and the E-mode NMOS 20 may be equal to each other.

Fourth Embodiment

The well 26 of the E-mode NMOS 20 is formed to have an impurity concentration lower than the impurity concentration of the well 16 of the D-mode NMOS 10. This reduces the influence of impurity scattering in the channel of the E-mode NMOS 20 correspondingly, thus increasing the mobility. In expectation of this effect, if the mobilities of the D-mode NMOS 10 and the E-mode NMOS 20 are set to be substantially equal to each other, the temperature characteristics thereof also become substantially equal to each other, and the temperature characteristics of the reference voltage VREF can be flattened.

The embodiments described above can be combined as appropriate.

What is claimed is:

1. A reference voltage generator, comprising:
    a depletion mode MOS transistor of a first conductivity type, for supplying a constant current flow; and
    an enhancement mode MOS transistor of the first conductivity type having a diode connection to the depletion mode MOS transistor, having a mobility equal to a mobility of the depletion mode MOS transistor, and generating a reference voltage based on a constant current;
    wherein the enhancement mode MOS transistor includes a well having an impurity concentration which is lower than an impurity concentration of a well of the depletion mode MOS transistor.

2. A semiconductor integrated circuit having the reference voltage generator according to claim 1.

3. A reference voltage generator, comprising:
    a depletion mode MOS transistor of a first conductivity type for supplying a constant current flow, the depletion mode MOS transistor having a single gate electrode; and
    an enhancement mode MOS transistor of the first conductivity type for generating a reference voltage based on a constant current, the enhancement mode MOS transistor having a single gate electrode, a diode connection to the depletion mode MOS transistor, and a mobility equal to a mobility of the depletion mode MOS transistor,
    wherein the enhancement mode MOS transistor includes a well having an impurity concentration which is lower than an impurity concentration of a well of the depletion mode MOS transistor.

* * * * *